United States Patent [19]
Wang et al.

[11] Patent Number: 5,879,523
[45] Date of Patent: Mar. 9, 1999

[54] CERAMIC COATED METALLIC INSULATOR PARTICULARLY USEFUL IN A PLASMA SPUTTER REACTOR

[75] Inventors: Hougong Wang, Cupertino; Peijun Ding, San Jose, both of Calif.

[73] Assignee: Applied Materials, Inc., Santa Clara, Calif.

[21] Appl. No.: 939,396

[22] Filed: Sep. 29, 1997

[51] Int. Cl.$^6$ ............................ C23C 14/34; C23C 16/04
[52] U.S. Cl. ................. 204/298.11; 204/298.31; 204/298.06; 204/298.14; 156/345; 118/715; 118/720
[58] Field of Search .......................... 204/298.06, 298.11, 204/298.12, 298.14, 298.31; 156/345; 118/715, 720, 721, 723 E, 723 ER, 723 I, 723 IR

[56] References Cited

U.S. PATENT DOCUMENTS 4,419,201 12/1983 Levinstein et al. ................. 204/298.31

OTHER PUBLICATIONS

Lech Pawlowski, The Science and Engineering of Thermal Spray Coating, 1995, pp. 28–52.

*Primary Examiner*—Nam Nguyen
*Assistant Examiner*—Rodney G. McDonald
*Attorney, Agent, or Firm*—Charles S. Guenzer

[57] ABSTRACT

A insulating part for use in a plasma reactor, particularly as a support for an electrically floating shield in a plasma sputtering reactor. The insulating part is composed of a metallic base and a partial surface covering of a ceramic insulator, such as alumina. Preferably the ceramic coating is deposited by thermal spraying. The insulating part can be easily affixed to other metal parts in the chamber by use of fastening means such as screws applied to the uncoated portions of the part. When the insulating part is used as an isolator to support but electrically isolate a second metal part, the second metal part may rest on the ceramic coating with the insulating part screwed to the chamber wall or other metal support member.

18 Claims, 3 Drawing Sheets

CERAMIC COATED METALLIC INSULATOR PARTICULARLY USEFUL IN A PLASMA SPUTTER REACTOR

FIELD OF THE INVENTION

The invention relates generally to insulators used in plasma reactors. In particular, the invention relates to a ceramic coated metal part.

BACKGROUND ART

Modern integrated circuits require many layers of metallization, for example of aluminum, for both contacts to the underlying silicon active areas and for complex interconnections between the separate devices. Plasma sputtering, also called physical vapor deposition or PVD, has become the most widespread method of depositing the metallization. In metal sputtering, a target is made of the same material as will be deposited. An inactive gas such as argon is admitted into the chamber at a very low pressure and is excited into a plasma by biasing the target negatively with respect to the chamber wall or other part. An exemplary biasing voltage is −600VDC. The plasma produces positively charged argon ions which are attracted to the target at sufficient velocities to dislodge atomic sized target particles. Some of the sputter particles strike the wafer being coated and are deposited thereupon as a layer of the material of the target.

The application of sputtering to advanced integrated circuits has imposed severe requirements upon the sputtering process. One of these requirements is that the sputtered metal effectively fill narrow, deep holes. In a typical IC structure, a dielectric layer of, for example, silicon dioxide, is deposited over a previous layer, which may be the underlying silicon layer or a previous metallization layer. Holes are etched through the dielectric layer, and sputtering then deposits an aluminum layer both into the holes and over the dielectric layer. The metal in the holes selectively contact the small defined portions of the underlying layer. The metal overlayer is then photolithographically defined into horizontal interconnects. The holes are called contact holes if silicon is being contacted at the bottom or via holes if another metal layer is being contacted. For very advanced integrated circuits, contact holes and the via holes for the lower levels of metallization are very narrow compared to the dielectric thickness to provide dense circuitry. As a result, sputtering must fill holes with very high aspect ratios, defined as the depth to the width of the hole. The aspect ratio may be 5 or more for advanced integrated circuits.

Hole filling is fostered by low chamber pressure such that particles sputtered from the target do not strike any argon atoms on the direct path to the wafer. This condition is expressed as the spacing between the target and wafer being approximately equal to or less than the mean free path of sputtered atoms in the operating pressure of argon or other sputtering gas. Such a ballistic trajectory favors a sputtered particle distribution that is peaked around the normal of the wafer, that is, directed into deep hole. Furthermore, techniques are available to ionize some of the sputtered particles so as to accelerate them to the wafer in a highly aniosotropic velocity distribution to thereby effectively fill the bottom of the hole. Excessive collisions would reduce the effectiveness of the directional extraction.

Another disadvantage of a high operating pressure and frequent collisions between the energetic sputtered atoms and the argon atoms is that sufficient energy may be imparted to the argon atoms to cause some of them to be embedded in the sputtered metal film.

However, in general if the chamber pressure is reduced too much, the plasma collapses, thus stopping the sputtering process. That is, there is a minimum plasma chamber pressure. The value of the minimum pressure varies with chamber design and is increased by unnecessary loss mechanisms. In typical commercial sputtering reactors, the DC potential of the wafer is left floating although an RF bias may be applied to it for the above described directional extraction. A generally cylindrical shield placed around the sputtering volume is grounded and acts as the anode for the negatively biased target. The shield additionally acts as a coating shield to prevent the walls of the chamber from being coated with the sputtered material. The shield can be easily replaced when it becomes excessively coated. However, the grounded shield tends to extract argon ions from the plasma, that is, acts as a loss mechanism for the plasma. The loss increases the minimum chamber pressure required to support the plasma To circumvent this problem in a cost effective way, Ding et al. disclose a two-part shield, one part electrically floating, the other grounded, in U.S. patent application, Ser. No. 08/677,760, filed Jul. 10, 1996 now U.S. Pat. 5,736,021 and incorporated herein by reference in its entirety. As illustrated in the cross-sectional view of FIG. 1, the PVD reactor 10 is principally defined by a main chamber wall 12 and a target 14 of the material to be sputter deposited upon a wafer 16 supported on a heater pedestal 18 in opposition to the target 14. A vacuum pump 20 can maintain a base pressure within the reactor 12 to below $10^{-6}$ Torr, but a gas source 22 supplies an inactive working gas such as argon into the chamber at a pressure in the low milliTorr range. An electrical insulator 24 forms a vacuum seal between the main chamber wall 12 and the target so that a DC power supply 26 can bias the target sufficiently negatively with respect to the chamber wall 12 to cause the working gas to be excited into a plasma in the volume between the target 14 and the pedestal 18. An unillustrated magnetron positioned on the back of the target 14 intensifies the plasma near the target 14 so as to increase the sputtering rate. According to Ding et al., two overlapping annular shields 30, 32 are disposed between the plasma processing volume and the chamber walls 10.

One of the purposes of the shields 30, 32 is to protect the chamber walls 10 from being sputter coated with the same material coating the wafer 16. When the shields 30, 32 become excessively coated, they can be easily removed and replaced without the necessity of an in situ cleaning.

Another purpose of the shields 30, 32 is to provide electrical biasing of the sputtering process. In this configuration, the pedestal 18 is electrically floating, and the bottom shield 32 is grounded to provide a cathode to the negatively biased anode of the target 14. The negative voltage applied between the grounded shield 32 and the target 14 causes the argon working gas to discharge into a plasma, and the resultant positively charged argon ions are attracted to the negatively biased target 14 with sufficient energy to sputter atoms and other atomic-sized particles from the target 14. Some of the sputtered atoms deposit upon the wafer while others coat the shields 30, 32. The top shield 30, however, is left electrically floating, and the mobile, electrically charged plasma particles eventually charge it up to a voltage intermediate the voltages of the target 14 and the grounded shield 32. Thereby, electrical arcs between the target 14 and the shield assembly 30, 32 are significantly reduced compared to the more conventional configuration of a single grounded shield extending close to the target. The floating shield 30 serves further purposes of reducing ion loss to the walls, thereby reducing the minimum pressure required to support and plasma, and also of guiding positively charged sputtered particles toward the wafer 16.

The reactor 10 illustrated in FIG. 1 is only schematically shown, and the illustration omits the support structure for the shields 30, 32. The detailed embodiment presented by Ding et al. uses a thick floating shield 30 of stainless steel resting on a flat annular ceramic spacer or ring, which is itself supported on an inwardly extending shelf of the chamber wall 12 through a rim of the grounded shield 32. The ceramic spacer provides the required electrical isolation between the chamber wall 12 and the floating shield.

The ceramic spacer, however, presents some problems. Ceramics are brittle and prone to cracking, especially during installation. The brittleness is exacerbated for more complexly shaped bodies having sharp corners. Also, fine particles tend to flake off from ceramics. Such particles are a major problem in advanced semiconductor fabrication. Yet further, it is difficult to join ceramic and metal pieces by means of screws and the like. Metal screws promote the cracking and flaking problems described above, and they further defeat the electrical isolation provided by the ceramic. Ceramic screws are available, but they in turn are subject to cracking and flaking in the high-stress function of threaded engagement. Finally, while metal parts can be economically machined in small quantities, the fabrication of ceramic parts entails a high start up cost which becomes prohibitive for only a few specialized parts. In view of these problems, the structure of Ding et al. supporting and engaging the floating and grounded shields 30, 32 does not use screws but instead is left mechanically floating with only the weight of the somewhat massive floating shield 30 mechanically biasing the grounded shield 32 against grounded chamber wall 12. As a result, physical separations cannot be precisely controlled, and the inevitable rubbing of parts during operation is likely to produce additional particles, especially from the ceramic spacer. Also, the electrical contact between the grounded shield 32 and the chamber wall 12 is uncertain.

Polymeric insulators are available, but they are generally unable to survive in the hostile plasma environment, particularly when high temperatures are involved. Of course, metals are usually not considered to be electrical insulators.

Accordingly, it is desirable to produce a support structure for an electrically isolated part of a plasma chamber that does not require a ceramic part.

It is further desirable that such a support structure be threadably engageable with the chamber wall.

SUMMARY OF THE INVENTION

The invention can be summarized as an electrically insulating part primarily formed form a metal member that is used in a plasma reactor. A ceramic insulating coating is deposited on parts of the part to thereby electrically isolate whatever faces or touches the ceramic coating from any metal member, such as the reactor chamber wall, to which the metal member is affixed.

In another aspect of the invention, screws or other mechanical fasteners applied to uncoated portions of the insulating part affix the part to yet other metal part. If the fastener is metallic the metal member of the insulating part is electrically contacted to the other part.

A preferred usage of the invention is to support an electrically floating shield to a grounded wall in a physical vapor deposition plasma reactor.

In a specific aspect of the invention, fastening means are applied to a conductive surface portion of the insulating part.

In a yet further aspect, a grounded shield or other grounded member is sandwiched between a conductive surface of the insulating part and a conductive, grounded portion of the chamber, thereby reliably supporting and grounding the grounded member.

DETAILED DESCRIPTION OF THE PREFERRED EMBODIMENTS

According to an embodiment of the invention, an electrically insulating member is formed of a metal base member and a surface coating of a insulating ceramic, preferably applied to only a portion of the base.

Figure 1:
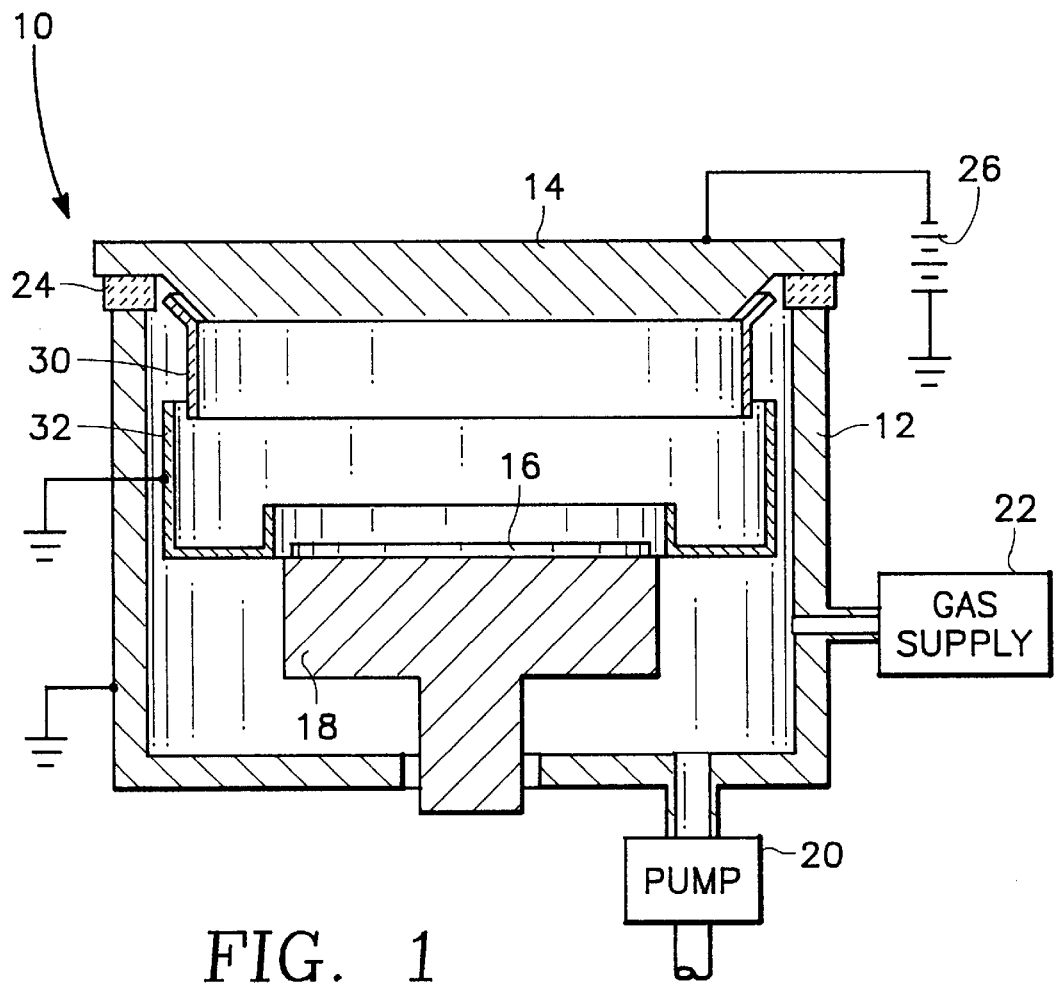
FIG. 1 is a schematic cross-sectional view of a sputtering reactor having an electrically floating shield.
Figure 2:
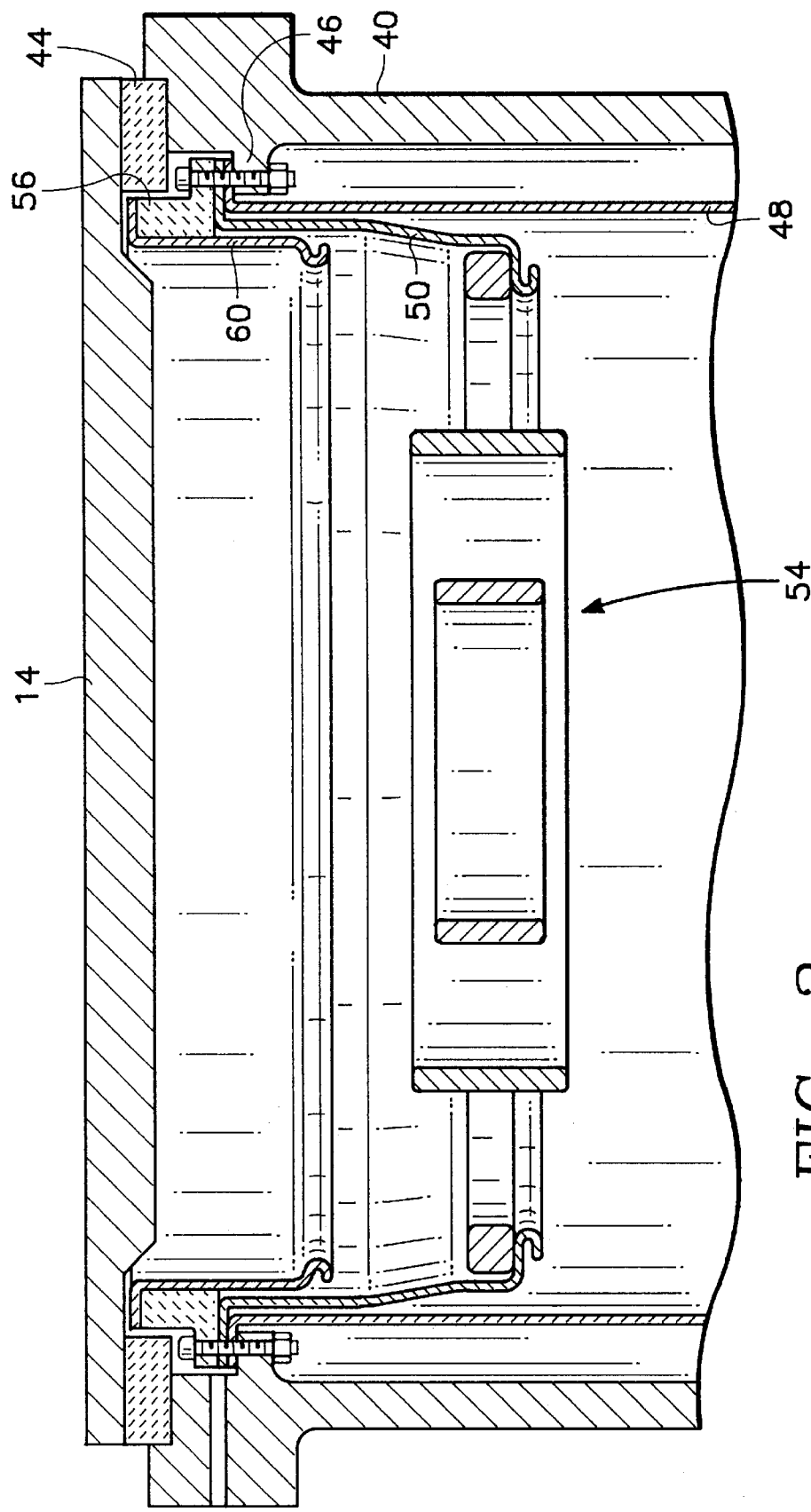
FIG. 2 is a cross-sectional view of a sputtering reactor having an electrically floating shield and an isolator of the invention.
Figure 3:
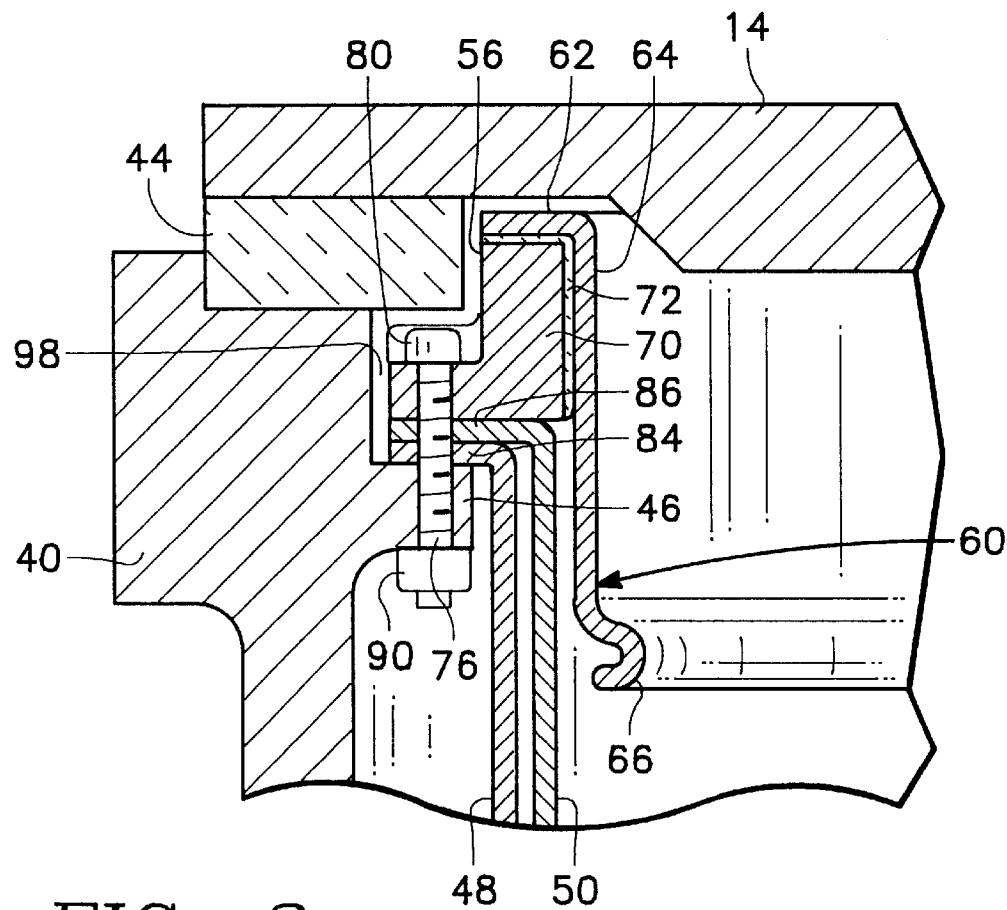
FIG. 3 is an enlarged cross-sectional view of a portion of the sputtering reacting in the neighborhood of the isolator of the invention.

A preferred configuration of a sputtering reactor is shown in the cross sectional view of FIG. 2 illustrating only the upper and novel portions of the reactor 10 of FIG. 1. The cross-sectional view of FIG. 3 is an expanded view of the upper left portion. The reactor includes an adapter 40 which is an upward extension of the principal chamber wall and is electrically grounded. The sputtering target 14 is supported on the adapter 40 through a ceramic insulator ring 44 and is negatively biased by unillustrated electrical means. Unillustrated O-rings or equivalent sealing means are positioned between the ceramic insulator 44 and the sputtering target 14 and adaptor 40 to provide a vacuum seal. An annular shelf 46 extends radially inwardly of the chamber and supports a grounded cylindrical wall shield 48 above which is supported a second grounded shield 50. The grounded wall shield 48 may have the bottom trough as illustrated in FIG. 1. A chimney 54 is held by the second grounded shield 50 at a position between the target 14 and the unillustrated wafer. Although not directly pertinent to this invention, the grounded chimney 54 allows the pedestal 18 supporting the wafer 16 to be electrically biased, preferably negatively, to control the velocity of ionized sputtered particles coating the wafer 16. Even without biasing, the chimney collimator 54 provides improved uniformity of sputter deposition across the wafer.

A floating shield 60 is supported on the isolator ring 56 by an outwardly extending lip 62 of the floating shield 60 disposed vertically above the bottom of the target 14. A cylindrical skirt 64 of the floating shield 60 extends from the shield lip downwardly into the chamber towards the chimney 54 and ends in an annular bent 66 to provide rigidity to the otherwise thin cylindrical wall.

Because the floating shield 60 is electrically insulated from other portions of the chamber, the plasma causes electrons to charge the floating shield 60 to the extent that its potential builds up to a negative value intermediate the potentials of the grounded shields 48, 50 and the negatively biased target 14. The increased negative potential repels ions, especially in the area immediately adjacent the target 14, and thus reduces plasma losses, thereby reducing the minimum plasma chamber pressure.

Figure 4:
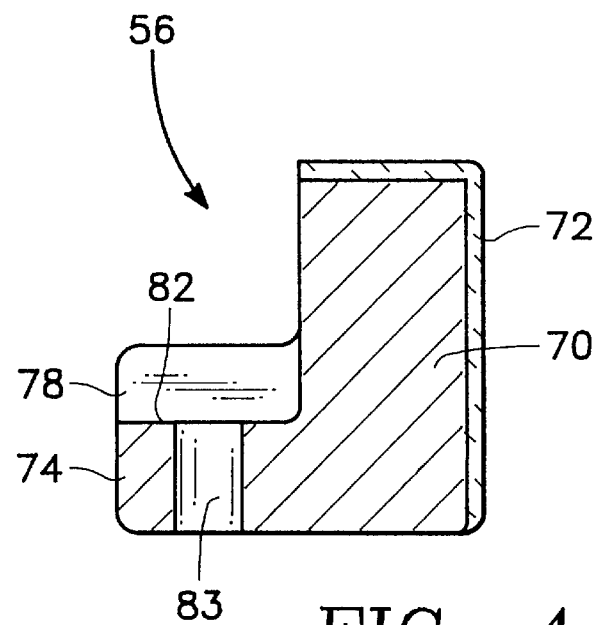
FIG. 4 is a cross-sectional view of the isolator.

According to one embodiment of the invention, the isolator 56 comprises, as shown better in the detailed cross-sectional view of FIG. 4, a metal body 70 and an electrically insulating ceramic coating 72, preferably covering only a portion of the metal body 70. A set screw 76 presses the metal body 70 against both grounded shields 48, 50 and the grounded adapter 40 so as to ground the shields 48, 50 to the adapter 40. The floating shield 60 rests on the ceramic coating 72 and is thus electrically isolated from the metal body 70, from the grounded shields 48, 50, and from the grounded adapter 40 and chamber walls.

The metal body 70 is composed of a metal. Stainless steel is preferred for the hostile plasma environment. However, less rugged metals such as aluminum may instead be used.

The ceramic coating 72 may be composed of an electrically insulating ceramic. A preferred example is alumina ($Al_2O_3$), but many other compositions may be used, such as zirconia ($ZrO_2$) alumino-titania (($Al,Ti)O_2$). Zirconia needs to be stabilized by other oxides, such as 20%MgO, 8 to 20% $Y_2O_3$, or 5% CaO. The alumino-titania may have 17 to 60% titania. In general, any electrically insulating ceramic coating can be used. The ceramic coating 72 is preferably applied only to the sides of the metal body 72 that supports and faces the floating shield 60. The remaining sides of the metal body 72 are left uncoated so that bare metal is left exposed. Thereby, standard metal fastening means can be used to mechanically fix the isolator 56 to the adapter 40 and the rest of the chamber.

In particular, in the described embodiment, the metal body 70 has an outer annular rim 74 extending radially outwardly from the bottom of the metal body 70 through which vertically three or more equally angularly spaced through holes. Set screws 76, as shown in FIG. 3, freely pass through the through holes and mechanically fix the isolator 56 to the adaptor 40 and to the rest of the chamber. In the preferred embodiment, there are twelve equally circumferentially spaced set screws.

As shown best in FIG. 4, at each screw position, a recess 78 is milled from the outer side of the isolator rim 74 to accommodate a flat-bottom head 80 of the set screw 76. The bottom of the recess 78 includes a flat metal surface of the isolator 56. A vertical through hole 83 is drilled through the isolator rim 74 in the area of the recess 78 to freely pass the shank of the set screw 76, as shown in FIG. 3. Importantly, when the set screw 76 is tightened, the flat bottom of the head 80 bears against the metal portion 82 of the isolator 56.

In the illustrated embodiment, through holes are also drilled through radially outwardly extending top lips 84, 86 of the two grounded shields 48, 50 to freely pass the shank of the set screw 76. The shield top lips 84, 86 are positioned between the isolator 56 and the inwardly extending annular shelf 46 of the adaptor 40. A through hole is also drilled through the adaptor shelf 46 to freely pass the set screw 76. A flat ring 90 has spaced threaded vertical holes into which the set screw 76 is threaded to engage the bottom of the adaptor shelf 46, thereby fastening the isolator 56 and the two grounded shields 48, 50 to the adaptor 40. The ring 90 is attached to the adaptor shelf 46 prior to the assembly of the shields 48, 50 by several other shorter set screws having heads depressed in recesses in the top of the adaptor shelf, having shanks passing through the adaptor shelf 46, and having threaded ends engaging other threaded holes in the ring 90. In an alternative design, the set screws 76 are threaded into tapped holes in the adaptor shelf 46.

The thickness of a gap 98 extending from the plasma volume of the reactor to the backside of the shield lips 84, 86 and of the isolator 56 is made small enough to prevent the plasma from propagating into the gap 98. That is, the gap 98 acts as a dark space at the operating pressure and voltage of the plasma reactor.

The ceramic coating may be applied by a variety of deposition techniques, such as chemical vapor deposition or RF sputtering. If a somewhat thinner insulating layer is acceptable, the layer may be anodized aluminum. However, the preferred coating method is thermal spraying, which may be any of several techniques involving the melting of a powder of the ceramic material in a gas stream directed at the part being thermally spray coated. An advantage of most of the thermal spraying techniques is that the metal body is coated only on the sides facing the thermal spray gun, and masking can be used to protect the areas to be left bare. Pawlowski discusses various thermal spraying techniques in his text *The Science and Engineering of Thermal Spray Coatings,* (John Wiley, 1995). Thermally sprayed coatings are easily identified by their textured surfaces resulting from the splattering of molten powder onto the substrate and subsequent rapid cooling and solidification. In an experimental verification of the invention, plasma spraying was used to coat a stainless steel metal body with a 0.5 mm thick coating of $Al_2O_3$. Preferrred ceramic thicknesses are 0.05 mm to 1 mm to provide dependable electrical isolation. Prior to the alumina spray coating, the stainless steel base was spray coated with a bond coating of a nickel-based alloy having the chemical composition of $NiAl_x$, with x having a value between about 0.05 and 0.1.

Experiments were performed to demonstrate the usefulness of the floating shield. The minimum pressure to maintain a plasma as well as the more accurately measured associated argon flow through a mass flow controller were determined for three commonly sputtered metals, copper, aluminum, and titanium. In the experiments of the invention, the ceramic coated metal isolator as described above was used to support a floating shield. In the comparative example, a standard grounded shield with no floating shield was used. These results are presented in TABLE 1.

TABLE 1

|  | Invention | | Conventional | |
|---|---|---|---|---|
|  | Pressure | Ar Flow | Pressure | Ar Flow |
|  | (mTorr) | (sccm) | (mTorr) | (sccm) |
| Copper | 0.27 | 6 | 0.6 | 12 |
| Aluminum | 0.35 | 3 | 0.8 | 8 |
| Titanium | 0.5 | 6 | 0.8 | 12 |

As can be seen, the floating shield allowed a reduction in the minimum chamber pressure by about a factor of two.

As described in the introduction, a low operating pressure is desirable to increase the filling of holes with high aspect ratios. Experiments were performed with filling 0.375 µm wide holes having aspect ratios of 3:1. In the examples, the chimney collimator was used, but not the biased heater. The use of the floating shield and a lower operating pressure increased the bottom coverage by about 60% compared to the use of a completely grounded shield and a higher operating pressure.

Although the invention has been described with respect to floating shields, similar beneficial results can be obtained with other parts of a plasma reactor which need to be mechanically fixed but be electrically insulating. Such use is not confined to physical vapor deposition but extends to other types of plasma reactors, such as plasma-enhanced chemical vapor deposition and plasma etching. The plasma may be formed by a variety of methods, including RF and DC capacitive coupling, inductive coupling, and a remote plasma source.

An example of other parts of a plasma processing chamber incorporating the invention relates to plasma guards which are often disposed around the periphery of the pedestal to guide the plasma towards the wafer and away from the pedestal. A plasma guard is often formed of an electrical insulator such as quartz. According to the invention, the plasma guard may be formed of a metal base with a insulating ceramic coating facing the plasma. The metal base may then be mechanically fixed to the pedestal or to other metal support structure.

The invention thus provides production worthy parts for a plasma reactor and allows for easy and economical fastening means which further reduce production of particles.

What is claimed is:

1. A plasma processing reactor, comprising:
   a plasma chamber including a metal part held at a potential;
   means for generating a plasma within said plasma chamber;
   a composite part affixable to said metal part by one or more threaded fasteners having respective heads and including
   a metal base having one or more holes through which said one or more threaded fasteners at least partially pass and having a first surface portion contacting said metal part, and
   an electrically insulating ceramic coating deposited on said metal base on a second surface portion of said metal base other than said first surface portion, said second surface portion being disposed with respect to an axis of one of said holes on an opposite side of said metal base from said first surface portion and from one or more planar portions abutting bottoms of said heads of said threaded fasteners, said planar portions not being coating by said ceramic coating.

2. A plasma processing reactor, comprising:
   a plasma chamber including a metal part held at a potential;
   means for generating a plasma within said plasma chamber;
   a composite part affixable by one or more threaded fasteners to said metal part and including
   a metal base having one or more holes through which said one or more threaded fasteners at least partially pass and having a first surface portion contacting said metal part,
   an electrically insulating ceramic coating deposited on said metal base on a second surface portion of said metal base other than said first surface portion, and
   a second metal part contacting said second surface portion of said base and exposed to said plasma.

3. A plasma sputtering reactor, comprising:
   a metal chamber wall adapted to insulatively support a target assembly comprising a target of a material to be sputtered;
   an insulating member supported on said metal chamber wall and comprising a metal base and a ceramic coating deposited on said metal base; and
   a cylindrically shaped electrically conductive shield having an outwardly extending support section supported on said ceramic coating of said insulating member.

4. The reactor of claim 3, wherein said ceramic coating is applied only to a first portion of said metal base, a second portion of said metal base other than said first portion being supported by said chamber wall.

5. The reactor of claim 4, further including at least one fastener applied to said second portion of said metal base and affixing said insulating member to said metal wall.

6. The reactor of claim 5, further comprising a second cylindrically shaped electrically conductive shield having an outwardly extending support section sandwiched between said second portion of said insulating member and said chamber wall.

7. The reactor of claim 3, wherein said ceramic coating is thermally sprayed onto said metal part.

8. The reactor of claim 3, further comprising a Ni-based bonding layer between said ceramic coating and said metal base.

9. Adapted for use in a plasma sputtering reactor having a metal chamber wall, a shield assembly comprising:
   an isolator comprising a metal base and a ceramic coating deposited on a first portion of said metal base, a second portion of said metal base not deposited with said coating being supportable with said metal chamber wall; and
   a first shield configured to be positioned in an area surrounded by said metal chamber wall and to contact said first portion of said metal base, whereby said shield is electrically isolatable from said metal chamber wall.

10. The shield assembly of claim 9, wherein said isolator has threadably attaching portions included in said second portion to threadably attach said shield to said chamber wall.

11. The shield assembly of claim 10:
    further comprising at least three sets screws and nuts able to be threaded together; and
    wherein said metal chamber wall has a ledge with a plurality of through holes for passing said screws therethrough; and
    wherein said shield has a plurality of through holes for passing said screws therethrough and has portions of said second portion around said through hole for abutting heads of said screws.

12. The shield assembly of claim 9, further comprising a second shield configured to be disposed between said second portion of said isolator and a portion of said chamber wall supporting said second portion of said isolator.

13. A shield assembly for use in a plasma sputter reactor, comprising:
    an annular isolator member comprising a metal base and a ceramic coating formed on a first axial side and an inner side thereof, a bottom side not being covered with said ceramic coating; and
    a first annular metallic shield member having
    an axially extending cylindrical skirt portion fittable within a central cavity of said isolator member, and
    a radially outwardly extending lip adapted to be supported on said first axial side of said isolator member.

14. The shield assembly of claim 13, wherein said metal base includes
    a rim extending radially outwardly from a second axial side of said metal base, and
    at least three equally angularly spaced holes axially extending through said rim and adapted to receive screws therethrough.

15. The shield assembly of claim 14, further including a second annular metallic shield member having
    an axially extending cylindrical skirt portion fittable outside of said skirt portion of said first shield member, and a radially outwardly extending lip adapted to abut said bottom side of said isolator member and including at least three axially extending holes alignable with said at least three holes of said rim of said base.

16. The plasma processing reactor of claim 1, further comprising a second metal part contacting said second surface portion of said base and exposed to said plasma.

17. The plasma processing reactor of claim 1, wherein said heads of said threaded fasteners have flat bottoms abutting said planar portions.

18. The plasma processing reactor of claim 17, further comprising a second metal part contacting said second surface portion of said base and exposed to said plasma.

* * * * *